United States Patent [19]

Fazi, Jr. et al.

[11] Patent Number: 4,819,503
[45] Date of Patent: Apr. 11, 1989

[54] LOW FREQUENCY STRUCTUREBORNE VIBRATION ISOLATION MOUNT

[75] Inventors: Valentino N. Fazi, Jr., New London; Ronald G. Murdock, Ledyard; Ernest O. Hancock, Fitchville; John W. McCready, East Lyme, all of Conn.

[73] Assignee: Unites States of America as represented by the Secretay of the Navy, Washington, D.C.

[21] Appl. No.: 137,558

[22] Filed: Dec. 22, 1987

[51] Int. Cl.$^4$ .......................... F16M 1/00; F16F 15/10
[52] U.S. Cl. ........................................ 74/574; 248/638; 248/632; 248/634; 248/635; 248/633; 310/51; 415/213 C; 415/119
[58] Field of Search ............... 248/638, 632, 634, 635, 248/633; 310/51, 63; 415/213 C, 119, 219 R; 74/574; 180/295, 299

[56] References Cited

U.S. PATENT DOCUMENTS

| | | | |
|---|---|---|---|
| 3,193,236 | 7/1965 | Thorn | 248/632 |
| 4,425,813 | 1/1984 | Wadensten | 248/638 X |
| 4,539,822 | 9/1985 | Sundquist | 248/638 X |
| 4,568,243 | 2/1986 | Schubert et al. | 415/213 C |
| 4,583,912 | 4/1986 | Ball et al. | 74/574 |
| 4,637,584 | 1/1987 | Takehara | 248/638 X |
| 4,648,579 | 3/1987 | Wilson | 248/638 |
| 4,655,099 | 4/1987 | Hansen | 248/638 X |
| 4,679,761 | 7/1987 | Small | 248/632 X |
| 4,711,135 | 12/1987 | Horiuchi et al. | 248/638 X |
| 4,711,423 | 12/1987 | Popper | 248/638 X |
| 4,727,695 | 3/1988 | Kemeny | 248/634 X |
| 4,744,539 | 5/1988 | Stimeling | 248/632 X |
| 4,754,827 | 7/1988 | Hirabayashi | 248/638 X |

Primary Examiner—Richard E. Moore
Assistant Examiner—Vinh Luong
Attorney, Agent, or Firm—Prithvi C. Lall; Arthur A. McGill; Michael J. McGowan

[57] ABSTRACT

A low frequency structureborne vibration isolation mount includes an annular disk pad of vibration damping material which is sandwiched and bonded between two similar light but rugged annular disks. The annular disk pad and the two annular disks have equal number of matching and corresponding holes along the circumferences thereof. The sizes of the holes are so chosen that one of the annular disks can be secured to the moving piece of equipment and isolated from everything else and the other annular disk can be secured to the stationary piece of equipment. The vibrations of the moving piece of equipment are thus isolated from everything else.

6 Claims, 1 Drawing Sheet

LOW FREQUENCY STRUCTUREBORNE VIBRATION ISOLATION MOUNT

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION (1) Field of the Invention

This invention relates to vibration noise reduction systems and more particularly to a vibration isolation mount for reducing low frequency structureborne vibration noise.

(2) Statement of Prior Art

Vibration noise resulting from the mechanical instability of a dynamical structure is very detrimental to monitoring of the electrical signals for operation of the structure. Such a noise exhibits itself in the form of low frequency vibration which will mask the real electrical signals and make the detection thereof difficult. Another problem posed by the structureborne vibration noise in the case of electrical motors for fans or the like in a moving body is that such a noise adds low frequency vibrations to the signatures of the moving body and thus makes detection thereof easy. Various methods have been adapted to solve the structureborne low frequency vibration noise problem, but there is still a need for a relatively simple and effective solution

SUMMARY OF THE INVENTION

The objectives add advantages of the present invention are accomplished by utilizing a vibration isolation mount for reducing structureborne low frequency vibrations. The mount includes a first disk and a second disk, a pair of two lightweight but rugged annular disks of similar configuration. One of the two annular disks or plates, the first disk, has a first plurality of holes of a first diameter and distributed along the circumference thereof and also has a second plurality of holes of a second diameter distributed in between the first plurality of the holes wherein the second plurality of holes have larger diameter than the first diameter. The second annular plate or disk has a third plurality of holes of the second diameter corresponding to and matching the first plurality of holes and also has a fourth plurality of holes of the first diameter corresponding to and matching the second plurality of holes of the first annular disk. Thus, the holes in the two annular disks are such that the first plurality of holes on one annular disk correspond to and match the third plurality of holes on the second annular disk. An annular disk pad made of a vibration damping material such as foam rubber is sandwiched between the two annular disks. The annular disk pad has holes along its circumference which are of the second diameter which match and correspond to all the holes on the two annular disks along their respective circumferences. The annular disk pad is bonded to one of the annular plates on one of its sides and to the other annular plate on the other side thereof. A series of set screws with corresponding rim clamps are used to attach one of the annular disks to the rotating equipment such as a fan and the second annular disk is attached to the stationary equipment such as a cabinet in which the electric fan is installed. This arrangement isolates the rotating equipment from the rest of the equipment and thus reduces the structureborne vibration noise being transferred to the stationary equipment.

An object of subject invention is to reduce the low-frequency structureborne vibration being transferred from a rotating piece of equipment to the stationary piece or pieces of equipment. Another object of subject invention is to use the vibration isolation mount in such a way that it becomes an integral part of the rotating piece of equipment. Still another object of subject invention is to isolate the rotating piece of equipment completely from the other piece or pieces of equipment. Still another object of subject invention is to remove the low frequency vibrations being transferred from the rotating part of equipment to any other parts of the equipment. Other objects, advantages and novel features of the invention will become apparent from the following detailed description of the invention when considered in conjunction with the accompanying drawings wherein:

DESCRIPTION OF A PREFERRED EMBODIMENT

Figure 1:
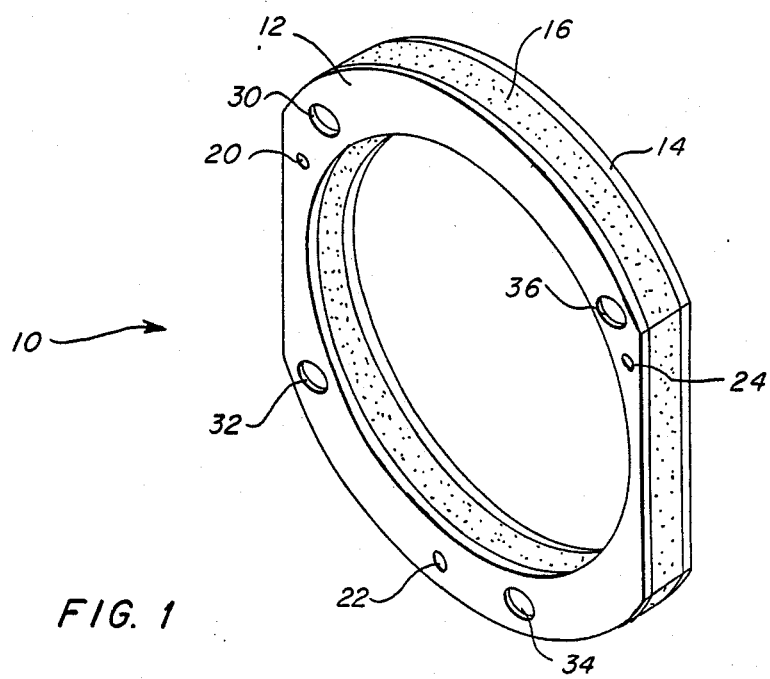
FIG. 1 is a perspective view of a low frequency structureborne vibration isolation mount according to the teachings of subject invention.
Figure 2:
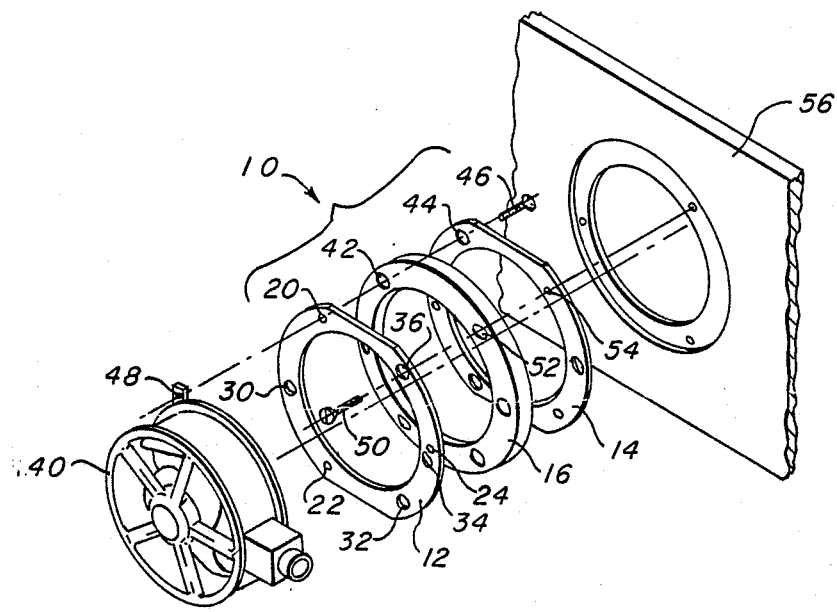
FIG. 2 an exploded view of the isolation vibration mount used for isolating the low frequency structureborne vibrations of an electric fan motor from the cabinet in which it is housed.

Referring to the drawings wherein like reference characters designate identical or corresponding parts throughout the several figures and more particularly to FIG. 1 thereof, a perspective view of the low frequency vibration isolation mount 10 is shown. Isolation mount 10 includes an annular disk or plate 12, a second annular disk or plate 14 of the same shape as plate 12. Annular disks 12 and 14 are bonded to an annular disk pad 16 of similar configuration as those of annular plates 12 and 14. Bonding may be accomplished by using pressure sensitive adhesive (PSA) or the like. Annular disks 12 and 14 are made of a light and rugged material such as an aluminum alloy and annular disk pad 16 is made of a vibration damping material such as one made by E.A.R. Company of Indianapolis and called C-3201-50 PSA/PSA. Annular disk 12 has a first plurality of holes 20, 22, and 24 along circumference thereof which have a small diameter; i.e., first diameter, and also has a second plurality of larger diameter; second diameter; holes 30, 32, 34 and 36. There are corresponding holes in annular disk 14 such that for every small diameter hole along the circumference of one annular disk there is a corresponding hole of larger diameter of the annular plate 14 and vice-versa. The annular disk pad 16 has larger diameter; the second diameter; holes corresponding to all the holes on annular plate 12 or 14 as seen in FIG. 2. The annular plates 12 and 14 are glued or bonded to annular disk pad 16 so that they become one unit which is called the vibration isolation mount 10. It should be remembered that the bonding of the two annular disks and the annular pad disk can be accomplished in many different ways by using either a glue or an epoxy or other similar material. FIG. 2 shows the vibration isolation mount using an exploded view and making vibration isolation mount 10 to be a part of the cooling fan 40. As can be seen from FIG. 2, the holes corresponding to hole 20 in annular plate 12 are holes 42 on annular disk pad 16 and hole 44 on annular disk 14. It can be seen from the figure that the holes 42 and 44 are of nearly the same diameter which is larger than the diameter of hole 20. Holes 20, 42, 44 are used to mount the fan 40 by using screws and nuts such as screw 46 and rim clamp 48. When the vibration isolation mount is mounted on fan 40 it becomes an integral part thereof. The attachment of annular plate 14 to the cabinet 56 is accomplished through the combination of holes 36 and 52 on annular disk 12 and annular disk pad 16 respectively and to annular disk 14 through hole 54, a tapered flat head screw 50 and a corresponding threaded hole on stationary cabinet 56. As can be seen from FIG. 2 when the vibration isolation mount 10 becomes an integral part of fan 40 which is now floating and not attached to cabinet 56. Any vibrations from the electric motor of fan 40 are then damped by the annular disk pad 16. It has been experimentally found that by use of a disk pad of proper thickness (preferably 0.5 inch thick) a 30 dB attenuation in the low frequency structureborne vibration noise was accomplished. It should be noted that the vibration isolation mount 10 as described and disclosed in subject invention has applications for damping the low frequency vibrations for many a moving machinery. It should be further noted that the sizes of the holes 20, 22, 24 and 30, 32, 34 and 36 on annular disk 12 and corresponding counterparts in annular disk 14 and annular disk pad 16 are critical for isolating the electric fan motor vibrations from the stationary cabinet, etc. By the use of proper size openings for screws and rim clamps such as 46 and 48 respectively, the fan can be suspended without any communication with the cabinet, etc.

Briefly stated, the subject invention is related to a low frequency vibration isolation mount to isolate a moving piece of machinery from transferring low frequency structureborne vibrations to the stationary cabinet in which the moving equipment is installed. This is accomplished by using a combination of an annular disk pad made of a vibration damping material sandwiched between two annular disks which are provided with appropriate size holes for mounting thereof to the moving machinery on one side and to the stationary equipment on the other side.

Modification and variation in the present invention are possible in light of the above teachings. As an example, the bonding of the two annular disks on the opposite sides of a disk pad made of a vibration damping material can be accomplished in many different ways. Furthermore, the material of the annular disk pad can be varied to accomplish the damping of the low frequency structureborne vibrations without deviating from the teachings of subject invention. It is therefore to be understood that within the scope of the appended claims the invention may be practiced otherwise than as specifically described.

What is claimed is:

1. A low frequency structureborne vibration isolation mount for reducing the structureborne vibrations of a moving piece of equipment being transferred to a stationary piece of equipment, attached thereto wherein said mount comprises:
   a first and second matching annular plates of the same shape;
   a matching annular disk pad made of an acoustic damping material sandwiched and secured in between said first and second annular plates;
   the first annular plate having a first plurality of holes of a first diameter and a second plurality of holes of a second diameter larger than the first diameter and interspersed between said first plurality of holes located along the circumference of said first annular plate;
   a third plurality of holes of said second diameter along the circumference thereof and matching and corresponding to said first plurality of holes of said first annular plate and a fourth plurality of holes of said first diameter along the circumference of said second annular plate matching and corresponding to said second plurality of holes of said first annular plate;
   a fifth plurality of holes of said second diameter along the circumference of said annular disk pad matching and corresponding to said first plurality of holes and said second plurality of holes along the circumference of said first annular plate;
   means for securing said first annular plate to the moving piece of equipment; and
   means for securing said second annular plate to the stationary piece of equipment.

2. The vibration isolation mount of claim 1 wherein the acoustic damping material of said annular disk pad is a foam rubber having frequency attenuation characteristics tuned to the natural having frequency attenuation frequency of the rotating piece of equipment.

3. The vibration isolation mount of claim 2 wherein said moving piece of equipment is an electric fan.

4. The vibration isolation mount of claim 3 wherein said stationary piece of equipment is a cabinet in which said electric fan is mounted.

5. The vibration isolation mount of claim 4 wherein said vibration isolation mount is an integral part of said electric fan by being a part of the aerodynamic body thereof.

6. The vibration isolation mount of claim 5 wherein said electric fan is suspended without any mechanical communication with any stationary piece of equipment.

* * * * *